US007148613B2

(12) United States Patent
Dally et al.

(10) Patent No.: US 7,148,613 B2
(45) Date of Patent: Dec. 12, 2006

(54) SOURCE FOR ENERGETIC ELECTRONS

(75) Inventors: Edgar B. Dally, Carmel, CA (US); Donald R. Gagne, Placerville, CA (US); Robert J. Espinosa, Campbell, CA (US); Joel Christeson, Placerville, CA (US)

(73) Assignees: Valence Corporation, Little Rock, AK (US); Teledyne Technologies Incorporated, Los Angeles, CA (US)

(*) Notice: Subject to any disclaimer, the term of this patent is extended or adjusted under 35 U.S.C. 154(b) by 338 days.

(21) Appl. No.: 10/822,890

(22) Filed: Apr. 13, 2004

(65) Prior Publication Data

US 2005/0225224 A1 Oct. 13, 2005

(51) Int. Cl.
*H01J 37/06* (2006.01)
*H01J 33/00* (2006.01)
*H01J 33/04* (2006.01)

(52) U.S. Cl. ............................... 313/361.1; 313/359.1; 313/363.1; 313/346 R; 250/492.3

(58) Field of Classification Search ............ 313/359.1, 313/361.1

See application file for complete search history.

(56) References Cited

U.S. PATENT DOCUMENTS

| | | | |
|---|---|---|---|
| 3,617,740 A | 11/1971 | Skillcom | |
| 3,780,334 A | 12/1973 | Leboutet | |
| 3,956,712 A | 5/1976 | Hant | |
| 4,061,944 A | 12/1977 | Gay | |
| 4,100,450 A | 7/1978 | Frutiger et al. | |
| 4,359,666 A | 11/1982 | Tornoe | |
| 4,664,769 A | 5/1987 | Cuomo et al. | |
| 4,728,846 A | 3/1988 | Yasuda | |
| 4,899,354 A | 2/1990 | Reinhold | |
| 5,126,633 A | 6/1992 | Avnery et al. | |
| 5,319,211 A | 6/1994 | Matthews et al. | |
| 5,378,898 A | 1/1995 | Schonberg et al. | |
| 5,457,269 A | 10/1995 | Schonberg | |
| 5,483,074 A | 1/1996 | True | |
| 5,523,577 A | 6/1996 | Schonberg et al. | |
| 5,557,163 A | 9/1996 | Wakalopulos | |
| 5,612,588 A | 3/1997 | Wakalopulos | |
| 5,621,270 A | 4/1997 | Allen | |
| 5,627,871 A | 5/1997 | Wang | |
| 5,682,412 A * | 10/1997 | Skillicorn et al. | 378/98.6 |
| 5,749,638 A | 5/1998 | Cornelissen et al. | |
| 5,783,900 A | 7/1998 | Humphries, Jr. et al. | |
| 5,789,852 A | 8/1998 | Cornelissen et al. | |
| 5,909,032 A | 6/1999 | Wakalopulos | |
| 5,962,995 A | 10/1999 | Avnery | |
| 6,255,767 B1 | 7/2001 | Lee et al. | |
| 6,407,492 B1 | 6/2002 | Avnery et al. | |
| 6,545,398 B1 | 4/2003 | Avnery | |
| 6,630,774 B1 | 10/2003 | Avnery | |
| 6,674,229 B1 | 1/2004 | Avnery et al. | |
| 6,750,461 B1 * | 6/2004 | Fink et al. | 250/492.3 |
| 7,026,749 B1 * | 4/2006 | Rho et al. | 313/346 R |
| 2003/0021377 A1 | 1/2003 | Turner et al. | |

* cited by examiner

*Primary Examiner*—Sikha Roy
(74) *Attorney, Agent, or Firm*—Stanley Z Cole

(57) ABSTRACT

There is described, for example, a generally cylindrical generator of energetic electrons that releases electrons from a vacuum enclosure into a surrounding space including into the atmosphere where the electrons may be used for a variety of applications including clean up of a flowing gas stream. Described is an efficient electron generator that emits more beam power than past structures in this class of devices and does so in connection with the treatment of gases or surfaces requiring treatment.

22 Claims, 5 Drawing Sheets

SOURCE FOR ENERGETIC ELECTRONS

This invention relates to an improved source or generator for the creation of energetic electrons. This device comprises a vacuum structure generally cylindrical in nature to facilitate the emission of electrons and to control their flow from a source within the vacuum into a surrounding volume where the electrons are put to use. The instant invention is more efficient than heretofore electron devices currently known for the same or similar applications, where efficiency is the ratio of beam power emitted into the region intended for its application compared to the input electrical power required to operate the electron beam device.

BACKGROUND

Various systems are dependent on applying energetic electrons in systems characterized by the absence of vacuum conditions. One such system uses electrons to reduce or eliminate volatile organic compounds contained in gas flows. This application is described, for example, in U.S. Pat. Nos. 5,319,211, 5,357,291 and 5,378,898. Electrons have also been used to reduce noxious odors and to destroy or reduce other compounds including inorganic materials and other toxics. See for example U.S. Pat. No. 4,396,580, U.S. Pat. No. 4,752,450 and U.S. Pat. No. 5,108,565. Toxics in this application means poisonous or disease causing toxins in air, other gasses, mists or attached to fine particles. Toxics are intended to include within its scope, hazardous and/or odoriferous compounds and other pollutants found or introduced into air or other gasses. In general a primary purpose of these systems has been that of reducing toxic, noxious and/or hazardous materials appearing in various forms in the environment. Also electrons have been used in sterilization processes, both for medicinal products and for food, curing of inks, plastics, paints and other compounds that require heat or radiation to stabilize them in their final useful form.

Electron beams have been created for these purposes using a vacuum unit including a source for electrons that are directed to an end window of the unit. The window is sealed with a thin foil (the window foil to maintain the vacuum and to separate the vacuum from the surrounding area at atmospheric or other conditions). The foil must be thin enough to permit electrons to pass through with a minimum loss of energy but strong enough to resist atmospheric pressure on the vacuum. In general, the foil is mounted against a metallic plate with openings throughout to provide structural support to the thin foil. An accelerating voltage is applied between the source and the plate to attract the electrons to the window area with sufficient energy to pass through the foil. However, electron beam (e-beam) devices in use suffer from short mean time between failures, limited power output, or high costs for large power output. Failure modes arise from failures of the source of emissions and failures of the foil due to pinholes caused by poor metallurgical integrity or through excessive heating by electrons passing through or a combination of both.

SUMMARY OF THE INVENTION

This invention is a new electron beam device. The device comprises a generally cylindrical shell of variable length concentric to an electron source such as a cathode, which extends approximately the length of the foil windows. The interior of the shell is under high vacuum. The cylindrical shell has a series of openings (windows) covered with thin material and sealed, after evacuation, to maintain the internal vacuum. The openings can be of any number, geometric shape, orientation, and location. A high voltage difference is applied between the electron emitter and outer shell and electrons emitted from the coaxial emitter are accelerated with sufficient energy to pass through the thin window material covering the holes of the support plate. The unit includes high voltage insulating feed-through components for connection to the high voltage source, cathode power source and any control electrode voltage sources. Techniques for removing heat generated within the unit and at the windows can also be included as part of the electron beam structure.

The use of a nominally cylindrical geometry for the device makes use of the inherent strength of a cylinder to support and hold the output foil and provides for simplified beam optics so that a higher percentage of the emitted and accelerated electrons strike and exit the beam exit window foils. Thus the output of the device is increased over prior art electron sources. The cylindrical shape also facilitates direct bonding of the beam exit foils to support plates in the vacuum housing. Such bonding facilitates good heat sinking of the beam exit window material that in turn allows the use of thicker foils than previously usable in standard equipment, thus reducing the probability of metallurgical failure of the foil material. This geometry permits a larger surface area to be used as exit areas so that equivalent or greater power can be emitted with reduced heat stress per unit area of exit window. The cylinder and cathode can be lengthened or the cylinder made larger in diameter, or both, to increase effective window area and/or voltage, thus increasing power output from the electron emitter.

DETAILED DESCRIPTION OF THE INVENTION

Figure 1:
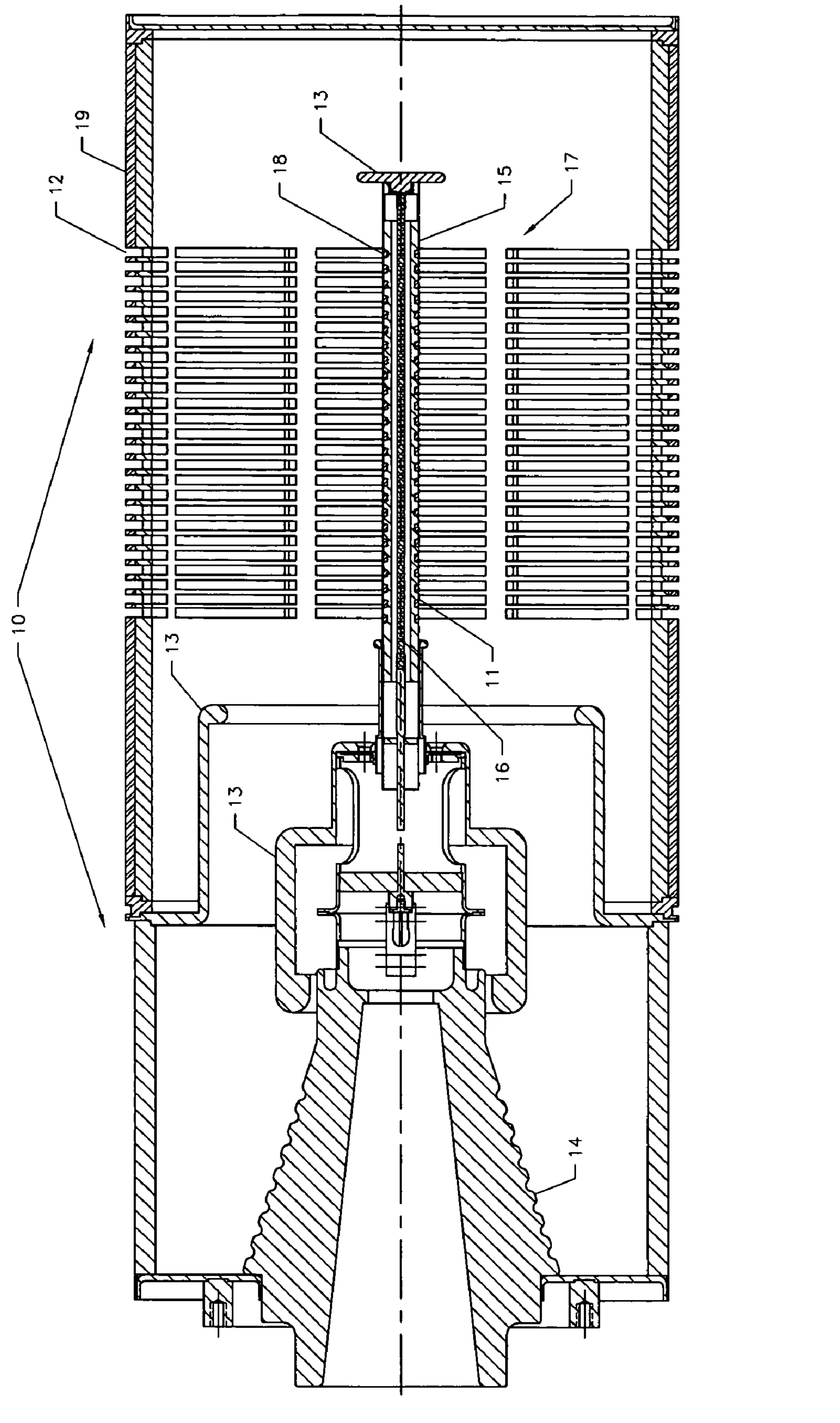
FIG. 1 is a schematic of the tube embodiment of this invention.

Referring now to FIG. 1, there is illustrated an embodiment of this invention. The electron flux generator 10 is of a generally cylindrical shape. It uses materials and construction techniques typically used in the design and manufacture of microwave tubes. For example a stainless steel shell for the tube will provide the structural strength needed to maintain the tube with a vacuum within and atmospheric conditions without. The electron flux generator 10 includes a cathode 11 which may comprise a dispenser type or an oxide type cathode, for example, or a tungsten wire filament, or filaments, heated to a high temperature or any variety of cold electron emission devices. Either a dispenser or oxide type cathode offers operation at relatively low temperature compared to a tungsten wire filament. The dispenser cathode, for example, operates at a temperature of less than about 1000° C. while an oxide type cathode operates at a temperature of less than about 850° C., compared to a tungsten wire filament that must be operated at 2,000 degree C. or more. If a cold electron emission device were used then a filament would not be required. Cathode 11 is heated by heater filament 16. In FIG. 1, a segmented dispenser type barium impregnated tungsten matrix cathode is used with individual emitters 18 spaced along the cylindrically shaped cathode 11 along non-emitting surface 15.

Figure 2:
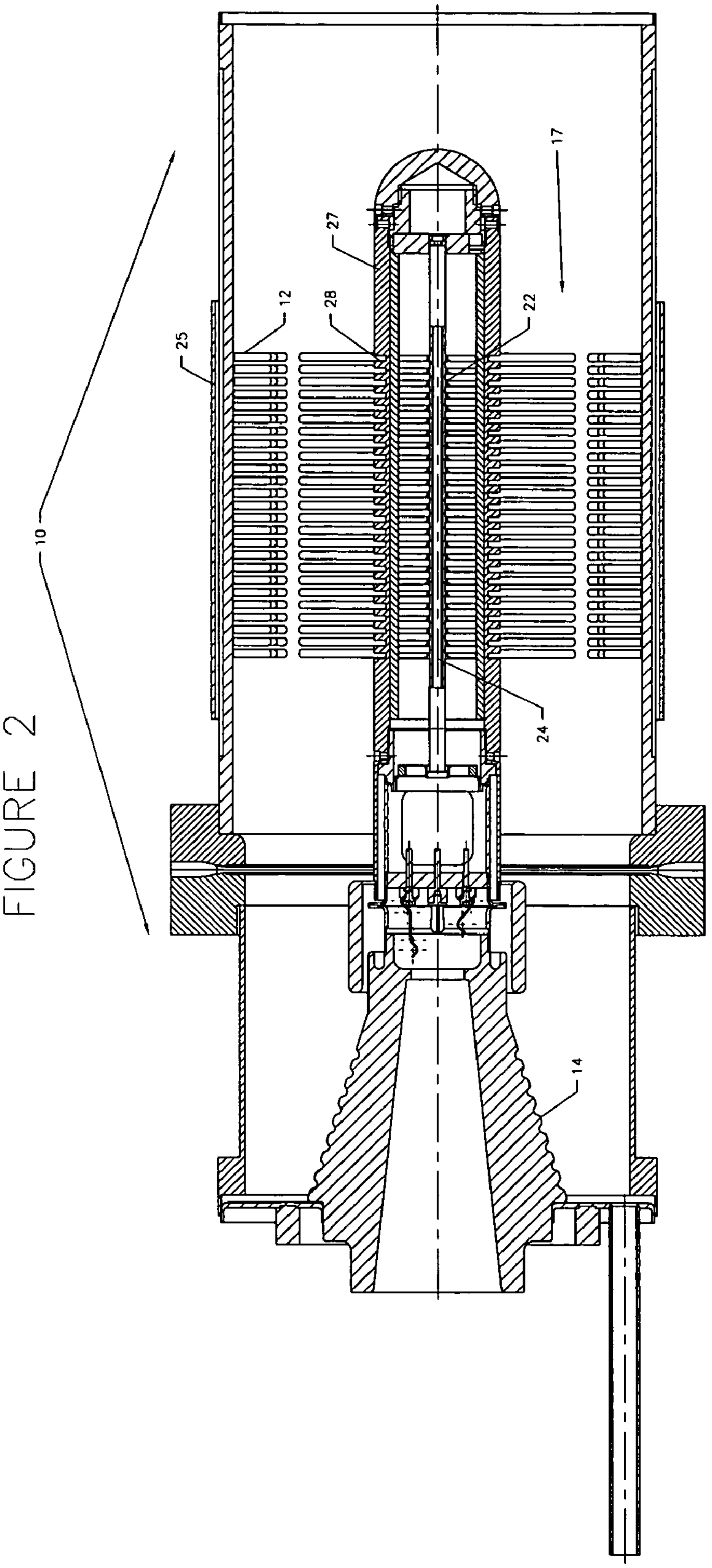
FIG. 2 is a schematic of the tube of FIG. 1 with a slotted grid.

A thin foil window 25 in FIG. 2 is not shown in place in FIG. 1. This is to permit a clearer illustration of window slots 12 (FIG. 1) in the circumference of the tube body. Thin foil windows would be in place in any tube or source intended for operation since the window seals the inner vacuum portion of the tube.

In a preferred embodiment a high voltage ceramic standoff 14 positions the internal sections of the tube which are at high voltage away from and insulated from the tube walls which are metallic and which are held at ground potential. At each end of the cathode within the tube are field shaping electrodes 13. The heater assembly 16 heats the complete cathode structure. The emitters 18 are aligned with the window slots 12. The slots are substantially the same width as emitters 18. A typical window slot can be, for example, approximately 0.1 inch wide, or more, with the corresponding cathode emitter surface being 0.08 inch, or more.

The window slots can subtend any desired angle but typically would be less then 90 degrees to allow for good structural strength in thin window elements against atmospheric pressure and adequate heat transfer from the window foil. The electric field lines are adjusted at the surface of the cathode by use of the field shaping electrodes 13 so that substantially all electrons emitted from the emitter portions 18 of the cathode 11 pass through the corresponding window slots 12. The cathode 11 is maintained at a high negative voltage, typically between, but not limited to, −100 kV and −250 kV, depending on the application, by means of a connecting receptacle connecting into the tube at the end where standoff 14 is located. Electrons generated at the cathode surface are accelerated through the vacuum region 17 towards the window slots 12. The window material may comprise a material having a thickness of about 0.001" but may vary both on the low and on the high side of this figure, depending on material used, desired efficiency and other factors such as reliability. The objective is to use a material that is sufficiently strong to maintain the vacuum and sufficiently thin to permit electrons to pass out of the vacuum to be applied outside of the source.

In this embodiment the temperature of the cathode 11 can be varied which in turn controls the amount of current emitted. Due to the low space charge density in this tube, the beam trajectories are constant over a wide range of cathode currents.

In FIG. 2 is shown a version of the focused electron flux generator 10 with a control grid. In this embodiment, the cathode is no longer segmented, but is replaced by a cylindrical cathode that has a continuous emitting surface 22 over a substantial portion of its length. A heater assembly 24 is inserted into the inner diameter of the cylinder of the cathode 22 to heat the cathode 22 to the desired temperature. A grid 27 is placed around the cylindrical cathode 22 concentrically and is slotted 28 to match the window slots 12. The grid slot width 28, distance to cathode 22, and to the window slots 12 are designed such that substantially all electrons emitted from each grid section are focused to pass through the corresponding beam exit window. A vacuum accelerating region 17 is illustrated, as is a high voltage ceramic stand off 14. A positive voltage is applied to the grid structure 27 to control net cathode current and to optimize the focused electron beam. As a result of the addition of the grid 27, the cathode current can be controlled using the cathode temperature or the cathode can be operated in the space charge limited mode and the grid used to control the current and trajectories. Shown in position in this FIG. 2 is the seal for the vacuum and exit window 25. The thin foil window 25, as illustrated, covers the entire area of all the window slots 12. The window may for, example, comprise, titanium or aluminum. Depending on application, energy and power levels, the window material may vary for example, in thickness from about 0.0002 inches to 0.002 inches with the presently preferred thickness of about 0.001 inch. The thicker the window, the more heat generated on passage of electrons through the window and the more difficult to pass electrons through the window with the result that it is generally preferred to use the thinnest window that will withstand the mechanical needs of sealing the system and still perform without failure. In the preferred embodiment, a titanium window is used. Other metals and certain ceramic materials, as used with microwave tubes, may also be used. The window material is bonded to the supporting shell. The bond should be a material with good thermal conductivity.

The greater the percentage of electrons that exit the device, the more efficient the device. Electrons striking the internal wall instead of passing through the windows represent wasted energy to the overall system. An electron striking the wall is lost to the application at hand, and, in addition, generates heat that must be dissipated. The more the requirement for cooling, the greater the demand on facility cooling power, which results in both higher capital investment and higher operating, costs.

One mechanism to assure the greatest output of energetic electrons from the tube is to vary the geometry of the slots and the spacing between slots in the window array to compensate for electron optic aberrations that occur within the tube between the grid and output slots and/or between the emitting cathode, the grid and the output slots. In order to determine how to structure these variations in the window areas, one normally would plot the electron trajectories within the tube and on that basis determine the optimum location for the window and optimum window structures.

The more efficient the process of generating electrons, the less the requirements of power supply capabilities. Power supplies are a major cost item in electron beam systems. Power supply capital costs grow non-linearly with power output. Reduction of overall power supply output demand also reduces operating costs. Additionally, electrons striking the internal surfaces also generate x-ray radiation. Thus, the fewer the electrons striking the wall, the less the shielding requirements are for the system. More shielding increases costs and in addition, since heavy atomic materials are used, considerably increases the weight and support requirements for the system. There is unavoidable X-radiation produced in the window foil, but due to its thinness, the intensity is significantly less.

In constructing tubes or electron sources efficiently in accordance with this invention, the flow of electrons is controlled by the way patterns of holes are cut or otherwise placed in the control grid. For example, if one wanted thirty degree back to back opening angles, the control grid would be cut in patterns of sets of back to back slots matching the window openings for thirty degree angular widths. The grid openings could alternatively be a multiple of the window slots, for instance, thirty-degree back-to-back slots in the windows could correspond with sixty degree back to back slots in the grid. The purpose is to minimize electron interception on the metal shell while optimizing production methods and cost. Likewise the window segments could be set up vertically along the length of the tube through which it is desired to have electrons pass. This invention also permits control of the output pattern in angles around the cylinder in order to; for example, generate an arc of less than the full 360 degrees subtended by the cylindrical tube.

Figure 3:
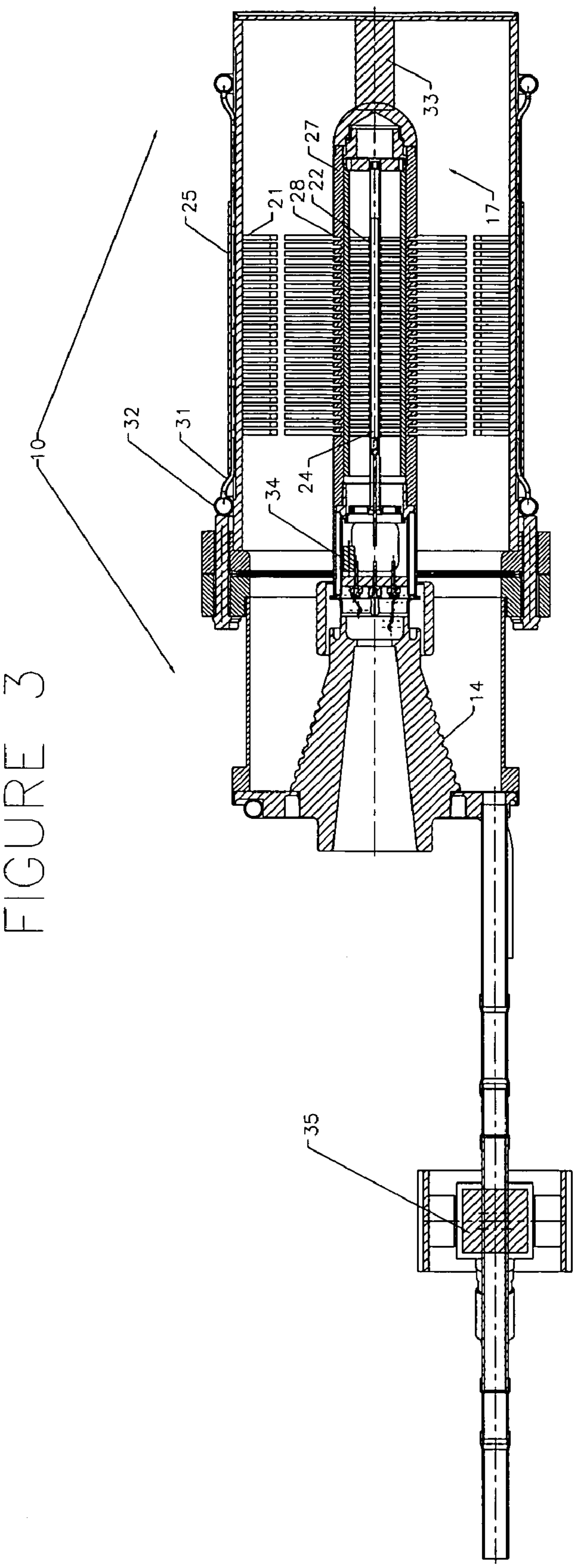
FIG. 3 is a schematic of the tube of FIG. 2 including water-cooling.

Referring now to FIG. 3, there is shown a version of tube 10 with a control grid, utilizing liquid cooling. Either the gridded or non-gridded embodiment may be liquid cooled, the description and means of cooling either type is substantially the same. In the embodiment shown, the device 10 comprises grid 27 including grid slots 28, cathode 22 and heater 24, window slots 12, ceramic stand-off 14, metallic foil 25, and vacuum accelerating region 17. Keeping the temperature of the thin foil as cool as possible is important to achieve reliable performance. Use of liquid cooling further enhances the advantages of the focused beam approach. Liquid cooling channels 31 (see FIG. 3) are located along the gaps between the window slots 12. Each individual cooling channel connects into the cooling manifold 32. The individual channels can be in parallel with one another to minimize pressure drop or they can be in series to minimize fluid flow. Heat removal can also be achieved by attaching cooling lines either internal to the vacuum side or on the exterior side of the shell.

The device illustrated and discussed in connection with FIG. 3 achieved the following results in operation. 160,000 volts were applied to the cathode and 90 volts were applied to the grid. The outer shell of the device was grounded and was less than a foot long and less than 6 inches in diameter. About half of the length was devoted to window areas. The device delivered internal beam power of 12,000 watts with approximately 5 kilowatts of beam power delivered into an air stream.

Although a cylindrically shaped device has been described, it should be understood that one can achieve the objective of creating a 360-degree pattern or defined fraction thereof along the length of a linear source. In this respect, the shape of the shell of the device may also be other geometric cross section such as rectangular, hexagonal, pentagonal, etc. or any combination of smooth curves and flat surfaces.

The beam exit window openings are integral to the cylindrical shell; that is, cut through the wall of the cylindrical shell, or cut through a shell of any cross sectional shape that might be employed in other versions of the invention. A beam window opening area may comprise any angular degree of the opening portion of the 360 degrees from very small angle to the full 360 degrees, or any combination of openings of angular portions of 360 degrees, such as back to back openings of the cylinder, or multiple openings of any angular degree at any angular location around the cylinder. Openings can be multiple longitudinal or radial openings relative to the surface of the cylinder or other shaped surface.

The invention also includes a linear source of electrons of any length for the cylindrical geometry of the system that is required for the application. The linear source may be fabricated from a thermionic filament heated sufficiently to emit the required flow of electrons, or from a linear source of any desired length whose emitting surface is generated by a dispenser cathode, indirectly heated by a filament. A long cathode, with or without grid, could require mechanical support at the distal end. A ceramic insulator 33 brazed to the end cap of the tube can be used for such a support.

The present invention also permits window openings of any geometric shape, orientation, or dimensions to be covered with thin material or combination of materials to maintain the integrity of the high vacuum required for system operation. There may be included in this device, as is well known in the art, a vacuum pumping system that may, for example, be an ion pump 35 sealed with the unit after bakeout, or the unit can be simply pinched off after bakeout in the manner of microwave tube devices, or can be pumped by other known detachable pumping systems and not sealed. Getter materials 34 for absorbing spontaneously emitted and entrapped gases can also be included within the device as is well known in the art.

The design of this source permits use of various diameters and lengths. The device can be made longer or the diameter increased to increase window surface area. This, in turn, permits an increased beam current to pass into the active reaction volume, thereby increasing total useful beam power. For certain applications, a longer source is desirable as, for example, for curing wide bands of paint or ink by direct electron doses.

Larger diameter devices support standoff of higher accelerating voltages, so that higher energy electrons can be generated. More energetic electrons extend the range of effective interaction, thus increasing the effective reaction volume. For example, more energetic electrons have a greater range so that toxic emissions in larger diameter pipes or stacks can be treated. For the same current as at a lower voltage, higher power is generated. In operation, for example, to treat volatile organic compounds that are extracted (stripped) from groundwater, one would mount the device so that a stream of air containing contaminants can be flowed through a reaction volume. During passage, energetic electrons generated by the device interact with the contaminants in the passing stream and destroy, remove, or convert toxics in the stream and pass a much cleaner stream out the output end.

The improved output of the instant invention can be used to sterilize a flowing gas by passing it through a reaction volume. In addition, surface sterilization can be achieved by passing the surface to be sterilized close to the emitting source. The emitting arc can be reduced to produce, in effect, a linear pattern of electron emission of any desired arc size along the tube to treat, for example, a surface or a coating. The surface can be moved beneath a stationary electron emitter or the emitter may be moved along the path of a stationary or curved surface which requires electron treatment.

Figure 4:
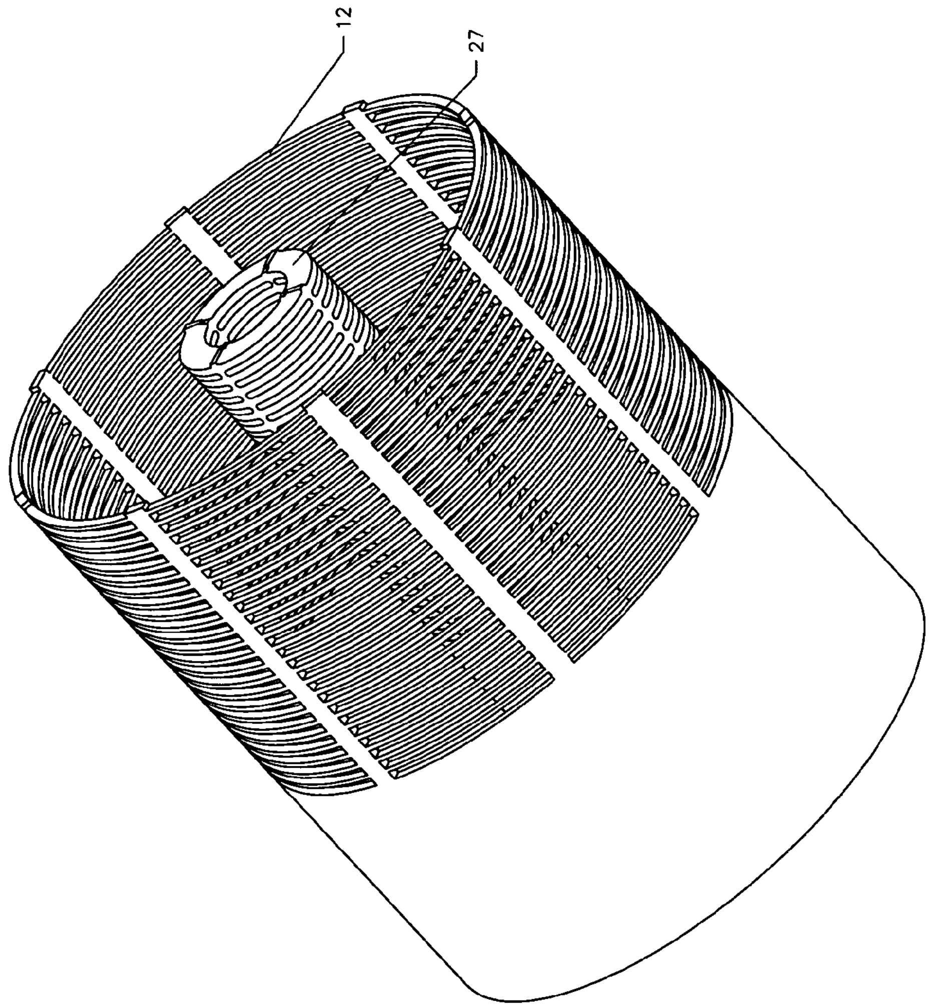
FIG. 4 is a schematic illustration of a cutaway view of a tube illustrating the outer surface, the slots in the surface and the grid of the tube.

In FIG. 4 there is illustrated slots 12 in the surface area of the tube and grid 27 located internally in the tube. In this illustration, window foils are not in place, as in the case of FIG. 1, so that the slots can be easily viewed.

Figure 5:
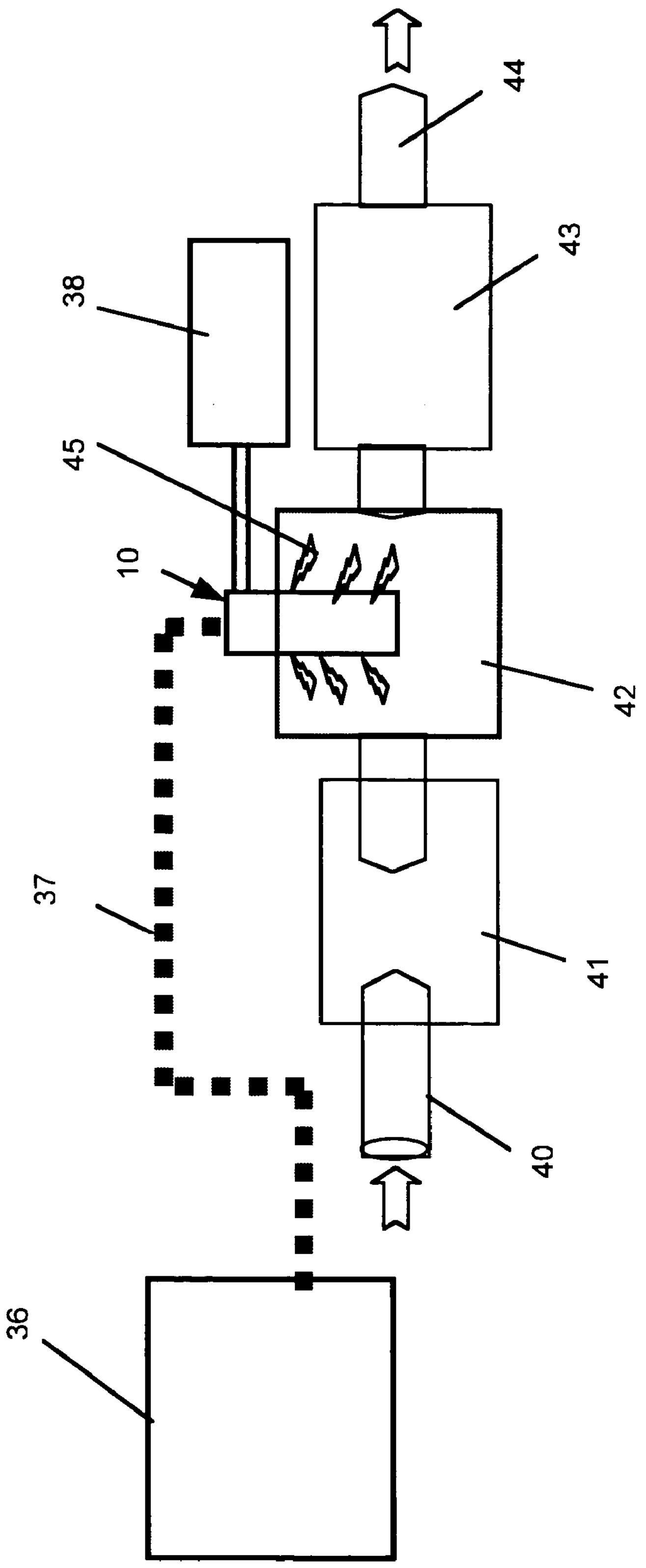
FIG. 5 is a schematic illustration of a tube in a system for toxic clean up of flowing gases.

In FIG. 5, for example, is illustrated a toxic gas cleaning system. A fluid to be treated enters the system at piping 40 and flows into pre-treatment equipment 41. Various pre-treatment processes may be incorporated into the system as for example is illustrated and discussed in U.S. Pat. No. 5,357,291 and in U.S. Pat. No. 5,378,898. These may include thermal treating systems, filters, aerators, dehydrators and the like. The gas, upon leaving the pre-treatment stage, enter into a reaction chamber 42. Present in the chamber is tube 10. In this Figure the output of the tube is illustrated as emissions one of which is identified as 45. The tube obtains high power from a high voltage power supply 36. 36 also includes controls for the system and outputs high voltage along a cable illustrated as the dotted line 37 to tube 10. A chiller 38 is shown to assist in the cooling of the tube 10. After treatment in reaction chamber 42, the effluent passes next to post treatment equipment 43 which may for example include scrubbers, charcoal containers and/or means to redirect the effluent back through the reaction chamber for further treatment. When treatment is completed, the effluent may flow out of the system along piping 44.

Various other configurations can be used to permit the effective use of the circumferentially released electrons as will be readily understood by those skilled in the art.

While there has been shown and discussed what are presently considered the preferred embodiments, it will be obvious to those skilled in this art that various changes and modifications may be made without departing from the scope of this invention and the coverage of the appended claims.

The invention claimed is:

1. An electron generator comprising:

a cylindrical shell for containing a vacuum, a series of openings in said shell extending around said shell, windows comprising a thin material positioned on and covering said openings and adapted to make said shell vacuum tight, an electron emitting surface positioned within said shell adapted to generate energetic electrons along its length, focusing elements to direct generated electrons to travel to said windows whereby a substantial percentage of the generated energetic electrons strike and pass through said windows and exit said generator.

2. An electron generator in accordance with claim 1 in which said electron emitting surface is axially continuous through substantially the length of said shell.

3. An electron generator in accordance with claim 1 including a grid between said electron emitting surface and said shell to focus emitted electrons toward the openings in the shell.

4. An electron generator in accordance with claim 3 in which said openings extend circumferentially around said shell and said grid is slotted and positioned such that electrons emitted from the cathode substantially either are intercepted by the grid or pass through the slots and are focused on to the windows of said shell.

5. An electron generator in accordance with claim 3 in which said electron emitting surface is a segmented dispenser cathode.

6. An electron generator in accordance with claim 3 in which said electron emitting surface is an oxide cathode.

7. An electron generator in accordance with claim 3 in which said electron emitting surface is a cold electron emission device.

8. An electron generator in accordance with claim 1 in which said windows comprise a metal foil.

9. An electron generator in accordance with claim 8 in which said windows cornprises titanium.

10. An electron generator in accordance with claim 1 in which the shell is liquid cooled.

11. An electron generator in accordance with claim 1 in which said electron emitting surface is a hot wire filament.

12. An electron generator in accordance with claim 1 in which foils of individual windows are bonded to the shell at the perimeters of the windows.

13. An electron generator in accordance with claim 12 in which said windows extend substantially around the cylinder in substantially a 360-degree arc.

14. An electron generator in accordance with claim 12 in which said windows extending around the cylinder cover less than 360 degrees.

15. An electron generator in accordance with claim 1 in which said windows are in the range of 0.0003" to several thousandths of an inch thick.

16. An electron generator in accordance with claim 1 in which the vacuum is continuously maintained during operation.

17. An electron generator in accordance with claim 1 in which an ion pump is attached to said generator, and the generator is pumped and baked and then pinched off downstream of the ion pump.

18. An electron generator in accordance with claim 1 in which said shell is pumped and baked and at the end of processing the said vacuum within said shell is pinched off.

19. An electron generator in accordance with claim 1 in which said shell includes a getter within the vacuum.

20. An electron generator in accordance with claim 1 in which electrodes mounted internally within said electron source focus electrons emitted from said cathode to strike the windows in said cylindrical shell.

21. An electron generator in accordance with claim 1 in which the slots of the tube vary in configuration and spacing from one to another to compensate for electron optic aberrations within the tube and to enhance the output of energetic electrons from the tube.

22. A gas cleanup system to remove toxics from a gas flowing through the system comprising an electron generator of claim 1 positioned within a housing to emit energetic electrons circumferentially in a zone within said housing and an intake into said housing to flow a gas to be treated through said housing and through said zone and out of said housing.

* * * * *